(12) United States Patent
Pahwa et al.

(10) Patent No.: US 12,432,880 B2
(45) Date of Patent: Sep. 30, 2025

(54) INTEGRATED BRACKET FOR ENHANCED HEAT DISSIPATION

(71) Applicant: Micron Technology, Inc., Boise, ID (US)

(72) Inventors: Shiva Pahwa, Bangalore (IN); Abhilash Ramamurthy Nag, Bangalore (IN); Suresh Reddy Yarragunta, Bangalore (IN)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 18/239,427

(22) Filed: Aug. 29, 2023

(65) Prior Publication Data

US 2024/0074110 A1 Feb. 29, 2024

(30) Foreign Application Priority Data

Aug. 31, 2022 (IN) .............................. 202241049779

(51) Int. Cl.
*H05K 7/20* (2006.01)
*F28F 3/04* (2006.01)
*G06F 1/20* (2006.01)

(52) U.S. Cl.
CPC ......... *H05K 7/20336* (2013.01); *F28F 3/048* (2013.01); *G06F 1/20* (2013.01); *H05K 7/20409* (2013.01)

(58) Field of Classification Search
CPC . G06F 1/20; G06F 1/185; G06F 1/206; G06F 1/3275; G06F 1/187; H05K 7/20409; H05K 7/20509; H05K 7/20336; H05K 7/2039; H05K 2201/066; H05K 2201/10159; H01L 23/36; H01L 23/3672; H01L 23/3736; H01L 23/427
USPC ..................................................... 361/679.47
See application file for complete search history.

(56) References Cited

U.S. PATENT DOCUMENTS

| | | | | |
|---|---|---|---|---|
| 3,749,156 | A * | 7/1973 | Fletcher ................. | B64G 1/503 165/47 |
| 9,841,793 | B2 * | 12/2017 | Kwon .................... | G11B 33/00 |
| 2004/0218362 | A1 * | 11/2004 | Amaro ............... | H05K 7/20409 361/679.54 |
| 2010/0097767 | A1 * | 4/2010 | Jude ...................... | H05K 5/061 361/709 |
| 2014/0036435 | A1 * | 2/2014 | Kim ......................... | G06F 1/20 361/679.33 |
| 2015/0146380 | A1 * | 5/2015 | Lu ...................... | H05K 7/14322 361/709 |
| 2015/0327402 | A1 * | 11/2015 | Slippey .............. | H05K 7/20336 361/714 |
| 2022/0354019 | A1 * | 11/2022 | Tsai ...................... | H01L 23/467 |

* cited by examiner

*Primary Examiner* — Mandeep S Buttar
(74) *Attorney, Agent, or Firm* — Schwegman Lundberg & Woessner, P.A.

(57) ABSTRACT

Example embodiments are directed to an input/output (IO) bracket that may be used in a solid-state drive (SSD), the IO bracket comprises a faceplate and at least one heat pipe coupled to the faceplate that extends horizontally from a surface of the faceplate. The at least one heat pipe is configured to be coupled to a controller of the SSD in order to transfer heat from the controller out of the SSD. By coupling the controller to the heat pipe instead of a main heatsink, the main heatsink can efficiently dissipate heat from remaining components of the SSD.

20 Claims, 6 Drawing Sheets

US 12,432,880 B2

INTEGRATED BRACKET FOR ENHANCED HEAT DISSIPATION

PRIORITY APPLICATION

This application claims the benefit of priority to Indian Patent Application Serial Number 202241049779, filed Aug. 31, 2022, which is incorporated herein by reference in its entirety.

TECHNICAL FIELD

The subject matter disclosed herein generally relates to input/output (IO) brackets for heat dissipation and more specifically to a peripheral component interconnect express (PCIe) IO bracket for enhanced heat dissipation.

BACKGROUND

Conventionally, a majority of enterprise Peripheral Component Interconnect Express (PCIe) solid state drives (SSDs) have heatsink designs for heat transfer that are similar and designed for maximum SSD power. Because most datacenter infrastructures are designed for American Society of Heating, Refrigerating and Air-Conditioning Engineers (ASHRAE) A2 standard (e.g., thermal regions work efficiently for up to 35° C. Ambient; 10,000 feet altitude), these conventional heatsink designs are typically compliant with ASHRAE A2. Recently, datacenters are moving to ASHRAE A3 (e.g., thermal regions work efficiently for up to 40° C. Ambient; 10,000 ft altitude) and above to minimize cooling requirements and save energy cost thereby improving total cost of ownership (TOC). With these constraints, it is challenging to meet thermal limits.

BRIEF DESCRIPTION OF THE DRAWINGS

Some embodiments are illustrated by way of example and not limitation in the figures of the accompanying drawings.

DETAILED DESCRIPTION

The description that follows describes systems, methods, techniques, and products that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures (e.g., structural components) are optional and may be combined or subdivided, and operations (e.g., in a procedure, algorithm, or other function) may vary in sequence or be combined or subdivided.

Example embodiments are directed to an IO bracket that improves overall system thermal performance by distributing controller heat to the IO bracket thus offloading or eliminating controller heat load from a main heatsink. In some cases, example embodiments are configured to completely offload or eliminate the controller heat load from the main heatsink. Disconnecting a high temperature controller from NAND (NOT AND) components helps for improving thermal throttling and assists with supporting a wide temperature range (e.g., support ASHRAE A3 standard). Example embodiments reduce effective heat load on the main or top heatsink as the controller heat is diverted towards the IO bracket and thereby reduces component NAND temperatures which improves heatsink efficiency. Further still, example embodiments support and/or meet thermal solution for higher power add on cards like PCIe and computer express link (CXL) devices. In some cases, example embodiments are able to handle high power dissipation>50 W with improved junction temperatures due to distributed heat load to the heatsink and the IO bracket. Thus, example embodiments provide IO brackets having the technical advantage of improving overall system thermal performance by distributing controller heat to the IO bracket thereby offloading or eliminating controller heat load from the main heatsink.

Figure 1:
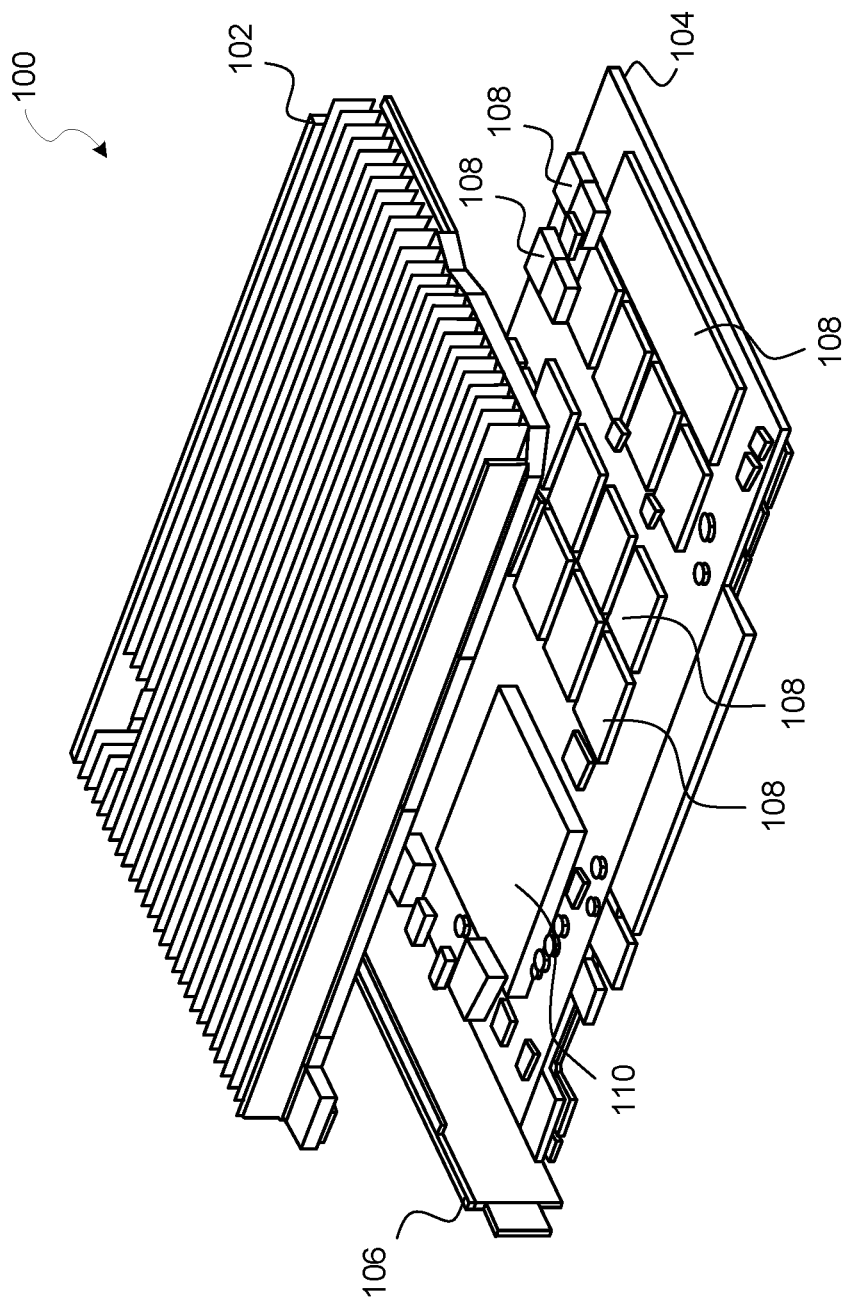
FIG. 1 is a diagram illustrating a conventional PCIe assembly.

FIG. 1 is a diagram illustrating a conventional PCIe assembly 100 associated with a solid state drive (SSD). The SSD can be, for example, full-height, half-length or be half-height, half-length in various embodiments. In the present case, it is shown as half-height, half-length. The assembly 100 comprises a top heatsink 102, a bottom cover 104, and a faceplate 106. The bottom cover 104 provides protection to any secondary-side components within the assembly 100 from physical damage. The faceplate 106 is a conventional IO bracket which is a dummy plate that does not have any connectivity and merely acts as a shield to protect input and outputs from being damaged while plugging in and out.

The top heatsink 102 is dedicated to the entire printed circuit board (PCB) and corresponding components. Thus, for example, the top heatsink 102 is responsible for transferring heat from various NAND devices/components 108 as well as from a controller 110. Typically, the NAND devices 108 and the controller 110 are thermally connected to the top heatsink 102 in order for the top heatsink 102 to dissipate the heat therefrom. In these convention embodiments, the controller 110 can cause the NAND devices 108 to overheat such that the NAND devices 108 cannot function properly at higher temperatures.

Figure 2:
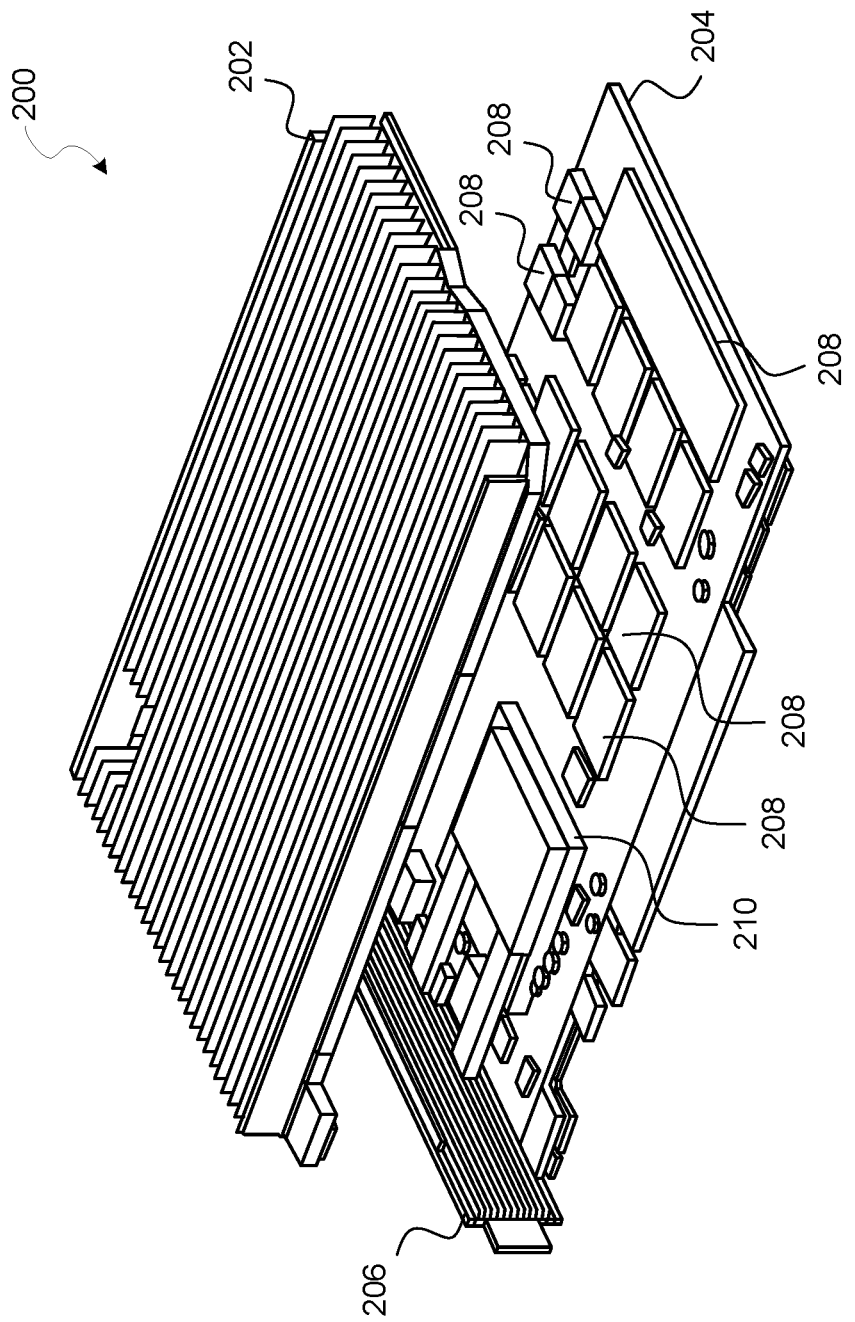
FIG. 2 is a diagram illustrating a perspective view of PCIe assembly having an enhanced input/output (IO) bracket, according to some example embodiments.

In order to provide a more efficient heat transfer mechanism (e.g., ASHRAE A3 compliant), example embodiments integrate a new IO bracket that is designed to transfer heat from the controller, thus offloading the heat from the controller from the top heatsink. FIG. 2 is a diagram illustrating a perspective view of a PCIe assembly 200 having an enhanced IO bracket 206 that functions as a heatsink, according to some example embodiments. In the embodiment shown in FIG. 2, a top heatsink 202 is similar to the top heatsink 102 of FIG. 1. Similarly, a bottom cover 204 is similar to the bottom cover 104 of FIG. 1 and NAND devices 208 are similar. As with conventional embodiments, the NAND devices 208 are thermally connected to the top heatsink 202 such that the top heatsink 202 transfers heat from the NAND devices 208.

Figure 3:
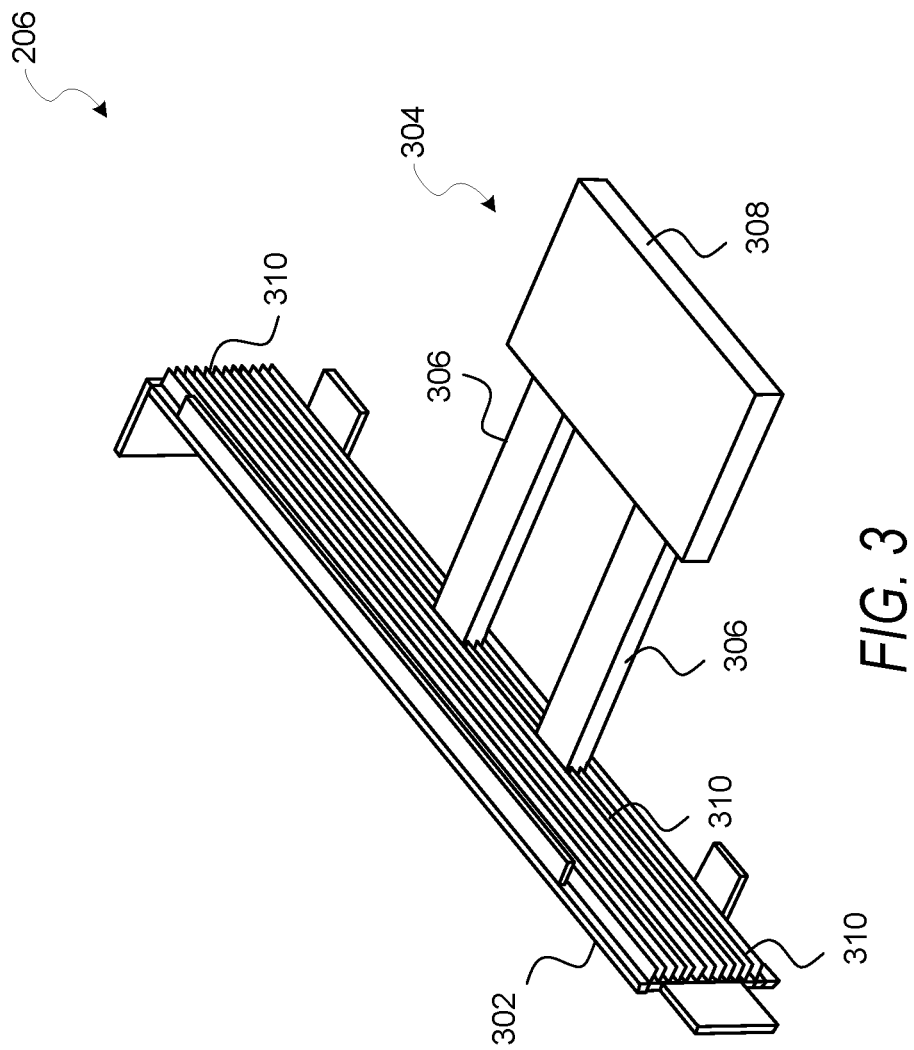
FIG. 3 is a diagram illustrating an exploded perspective view of the enhance IO bracket of FIG. 2, according to some example embodiments.

However, the enhanced IO bracket 206 comprises a different design. Specifically, the enhanced IO bracket 206 functions as a heat transfer element to one or more higher power components (e.g., a controller 210) in order to decongest (e.g., reduce amount of heat that needs to be transferred using) the main or top heatsink 202. Referring now to FIG. 3, an exploded perspective view of the enhanced IO bracket 206 of FIG. 2 is shown. The IO bracket 206 comprises a faceplate 302 and a heat pipe construction or assembly 304 that includes two heat pipes 306 that extend horizontally from an interior-facing surface of the faceplate 302 and a controller plate 308. The heat pipes 306 are configured to dissipate heat to an external surface of the faceplate 302 where ambient temperature can assist in cooling down the IO bracket 206.

In example embodiments, the controller 210 is coupled (e.g., thermally connected) to the heat pipes 306 and disconnected from the top heatsink 202. As a result, the top heatsink 202 can provide heat transfer capabilities exclusively to other components of the assembly 200 including the NAND devices 208, thus increasing efficiency of the NAND devices 208. By removing the heat from the controller 210 from the top heatsink 202, the top heatsink 202 operates more efficiently for the NAND devices 208 so that performance can be optimized. Specifically, the moment that heat on the NAND devices 208 comes down, the performance of these NAND devices 208 drastically increases.

The controller plate 308 is a component of the heat pipe assembly 304 where ends of the heat pipes 306 are embedded. In one embodiment, the controller 210 is coupled to (e.g., thermally connected, touching) a surface of the controller plate 308. For example, the controller can be coupled to a top or bottom surface of the controller plate 308. In other embodiments, the controller 210 is coupled to the heat pipes 306 instead of the controller plate 308.

In some embodiments, the faceplate 302 comprises a heatsink fin structure that includes a plurality of fins 310 configured to extend into an interior of the assembly 200. In one embodiment, the plurality of fins 310 are horizontal fins that extend at least a portion of a length of the faceplate 302. In an alternative embodiment, the fins 310 can be vertical fins that extend at least a portion of the height of the faceplate 302. The use of the plurality of fins 310 can increase a rate of heat transfer from the assembly 200 by increasing the heat transfer area.

In some embodiments, a plurality of vents that provide ventilation are positioned between the fins 310. In these embodiments, airflow is allowed to flow through the assembly 200 such that the airflow exits through the vents (not viewable), thus providing more heat dissipation capability and efficiency to the assembly 200. The plurality of vents will be discussed in more detail below.

Figure 4:
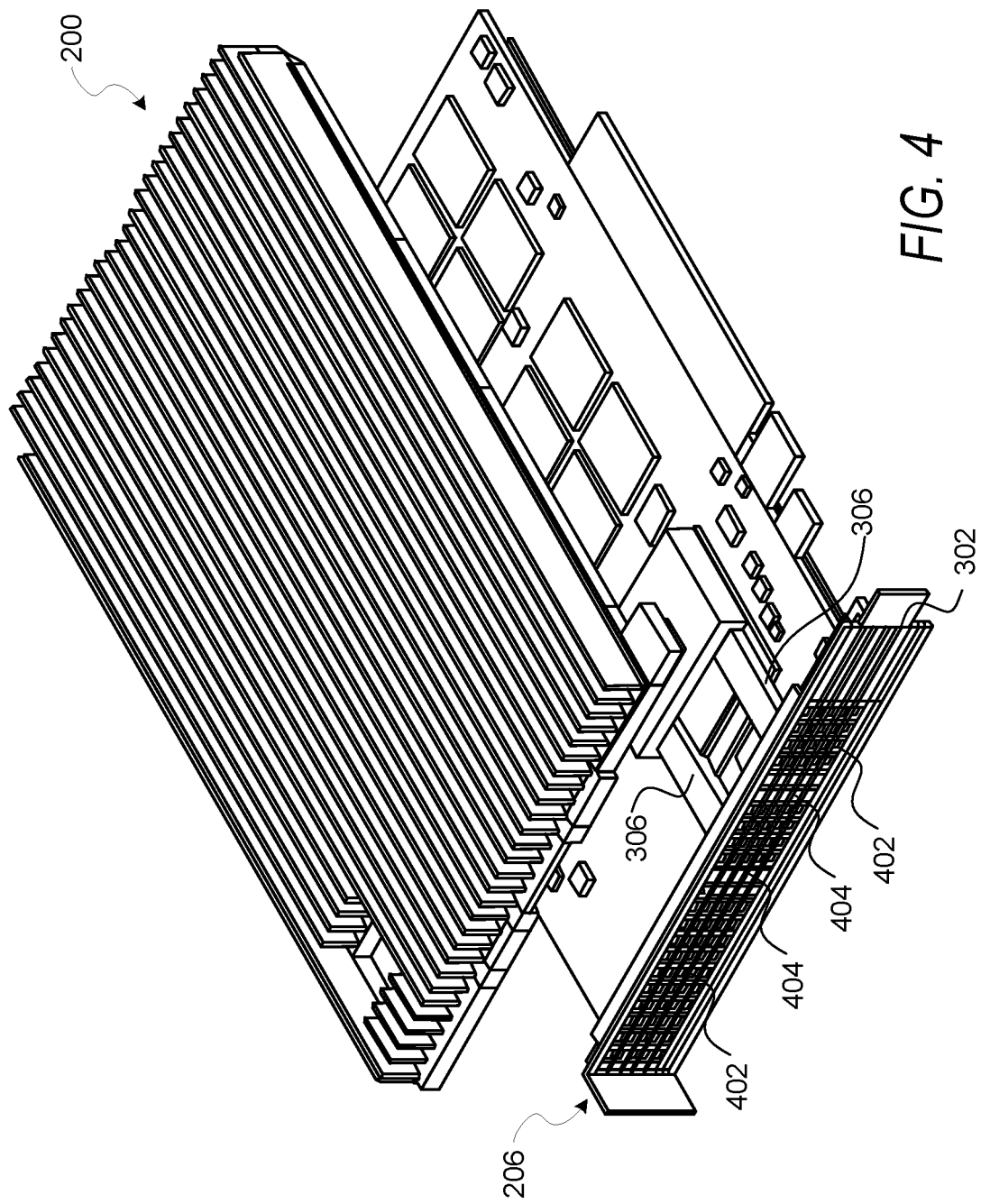
FIG. 4 is a diagram illustrating an alternative perspective view of the PCIe assembly having the enhanced IO bracket, according to some example embodiments.

FIG. 4 is a diagram illustrating an alternative perspective view of the PCIe assembly 200 having the enhanced IO bracket 206, according to some example embodiments. Here, the assembly 200 is rotated to show an exterior surface of the IO bracket 206 as it is positioned with respect to the assembly 200. In the view of FIG. 4 (and FIG. 5 below), the vents 402 are visible. The vents 402 are positioned between the plurality of fins 310 and allow airflow to exit from the assembly 200.

FIG. 4 also illustrates connecting members 404 of the heat pipe assembly 304. The connecting members 404 attach the heat pipe assembly 304 (e.g., including the heat pipes 306 and controller plate 308) to the faceplate 302. The connecting members 404 will be discussed further below.

Figure 5:
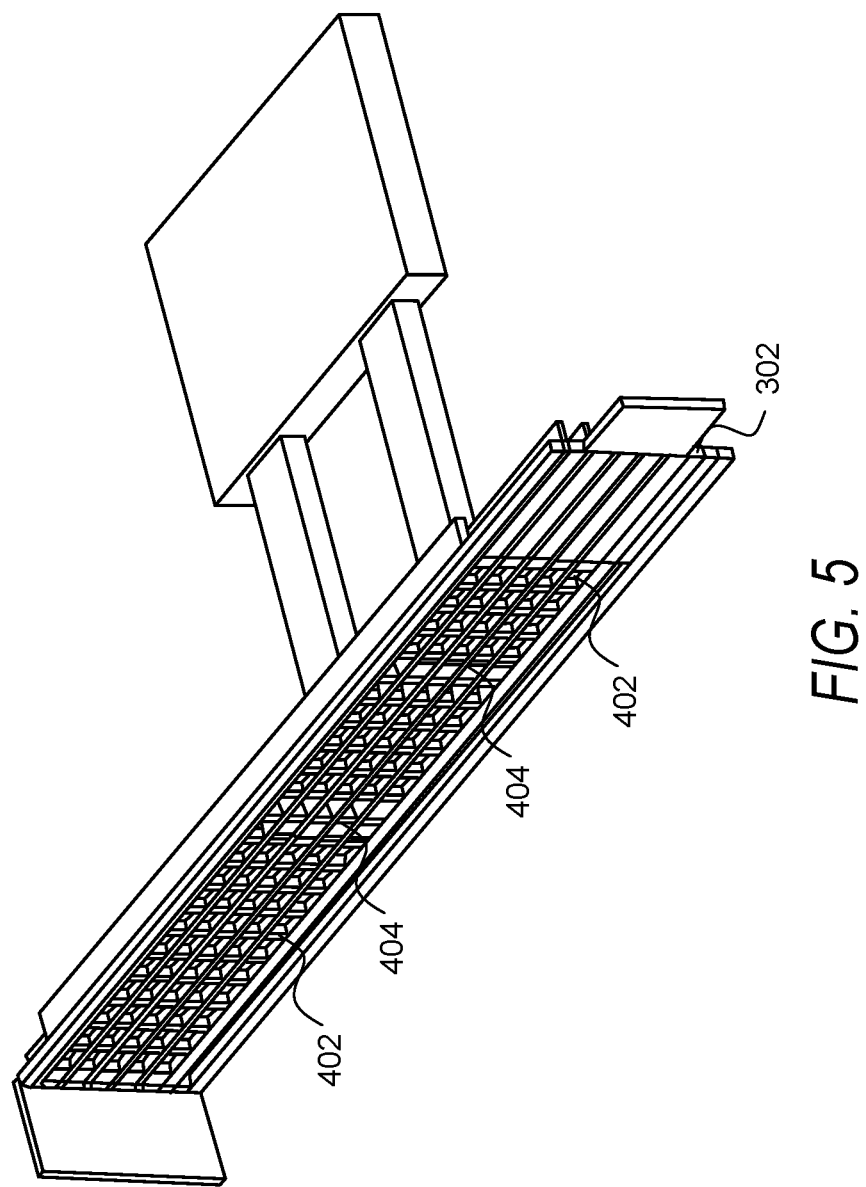
FIG. 5 is a diagram illustrating an exploded view of the alternative detailed perspective view of FIG. 4, according to some example embodiments.

Referring now to FIG. 5, an exploded view of the detailed perspective view of FIG. 4 is shown whereby the plurality of vents 402 are more clearly illustrated. While the vents 402 are shown as small rectangular openings in the faceplate 302, alternative embodiments can contemplate using other shapes or dimensions for the vents 402. For example, horizontal support structures can be removed from the sides of the vents 402 resulting in the vents 402 being long horizontal openings between and on either side of the connecting members 404. In some cases, the size and shape of the vents 402 may be dependent on the size (e.g., length, height) and orientation of the plurality of fins 310 (e.g., horizontal sides of the vents 402 match horizontal lengths of the fins 310).

FIG. 5 also shows how the heat pipes 306 are embedded in the controller plate 308. As discussed, the controller plate 308 may be in direct contact (e.g., thermally connected) to the controller 210 and transfer heat from the controller 210 via the heat pipes 306 out of the assembly 200. In some embodiments, the controller plate 308 is optional.

Figure 6:
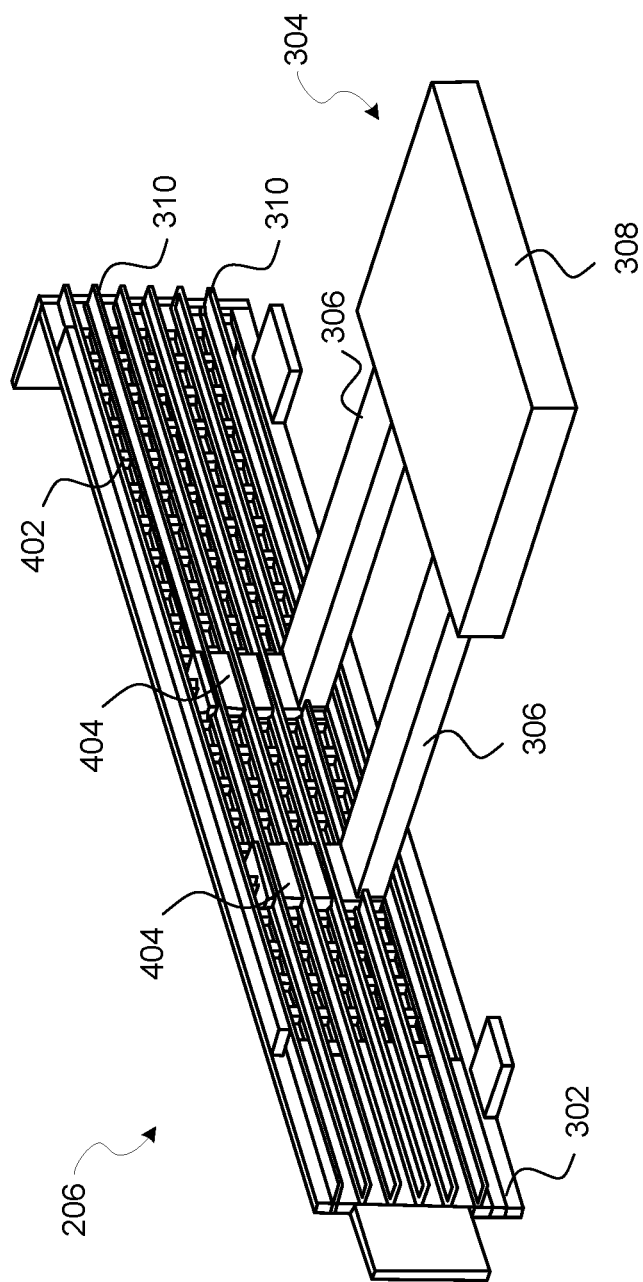
FIG. 6 is a diagram illustrating a further detailed perspective view of the enhance IO bracket, according to some example embodiments.

FIG. 6 is a diagram illustrating a further detailed perspective view of the enhanced IO bracket 206, according to some example embodiments. FIG. 6 provides a more detailed view of the connecting members 404 of the heat pipe assembly 304. As shown, the connecting members 404 are connected to one end of each heat pipe 306 (e.g., the ends that are opposite of the controller plate 308) and extend vertically therefrom along the faceplate 302 to anchor the heat pipe assembly 304 to the faceplate 302. In some embodiments, the plurality of horizontal fins 310 extend across the faceplate 302 such that they encompass portions of the connecting members 404.

It is noted that the number of connecting members 404 is dependent on the number of heat pipes 306. Thus, if only one heat pipe 306 is present in the heat pipe assembly 304, then only a single connecting member 404 will be used to connect the heat pipe assembly 304 to the faceplate 302.

While FIG. 4 to FIG. 6 illustrates one mechanism for connecting the heat pipes 306 to the faceplate 302, alternative embodiments may contemplate a different design. For instance, the connecting members 404 may not extend fully to a top surface of the faceplate 302 (e.g., extend halfway vertical along the faceplate 302). Alternatively, the heat pipes 306 can be directly connected to faceplate 302 without the use of the connecting members 404. In another alternative example, the connecting members 404 can be connected to and extend horizontally along a portion of the faceplate 302 or be connect to and extend both vertically and horizontally along portions of the faceplate 302.

Further still, while a width of the connecting members 404 are shown to be the same width/diameter as the heat pipe 306, the connecting members 404 can be wider or narrower than the width/diameter of the heat pipe 306.

While two heat pipes 306 are shown in the embodiment of FIG. 2 through FIG. 6, it is contemplated that any number of heat pipes 306 may be used. For instance, a single heat pipe 306 can be connected to the controller 210. Conversely, more than two heat pipes 306 can be used. The number of heat pipes 306 used will depend on design constraints (e.g., amount of room within the assembly 200 for the heat pipes 306) and/or a heat load of the corresponding controller.

Further still, while the heat pipes 306 shown in the embodiment of FIG. 2 through FIG. 6 are of the same length and diameter (whereby diameter refers to a cross-sectional width and/or height of the heat pipe 306), alternative embodiments may use different lengths and diameters. Here too, the diameter and length of the heat pipes 306 are dependent on design constraints and the heat load of the corresponding controller 210. In various embodiments, having a diameter that is too large (e.g., configured to dissipate more heat than created by the corresponding controller 210) is not optimal and could be costly (e.g., reducing a diameter can result in costs being reduced). Therefore, diameter can vary based on the heat load of the controller 210.

In embodiments with more than one heat pipe 306, the heat pipes 306 may have different diameters relative to each other. Because each heat pipe 306 can only carry a certain heat load, if the heat transfer amount is an odd number, the diameters of the heat pipes 306 can be different since having the heat pipes 306 be the same diameter would be excessive and thus potentially costly.

While the embodiments of FIG. 2 through FIG. 6 show heat pipes 306 having a rectangular cross-section, alternative embodiments can comprise heat pipes 306 of various cross-sectional shapes. For example, the heat pipes 306 can have a square or elliptical cross-section. The cross-sectional shape can be dependent on design constraints.

A material used to construct at least a portion of the IO bracket 206 (e.g., the faceplate 302, the fins 310 of the fin structure) is dependent on heat loads and can vary. In various embodiments, portions of the IO bracket 206 can be constructed from aluminum, graphite, or copper. However, other materials can be contemplated based on heat transfer requirements.

While example embodiments discuss the use of the enhanced IO bracket in PCIe assemblies, the IO bracket 206 may be used with other expansion bus standards and standardized interfaces.

Throughout this specification, plural instances may implement components, operations, or structures described as a single instance. Conversely, single instances can be implements as plural instances. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

In view of the disclosure above, various examples are set forth below. It should be noted that one or more features of an example, taken in isolation or combination, should be considered within the disclosure of this application.

Example 1 is a peripheral component interconnect express (PCIe) assembly comprising a controller and NOT AND (NAND) devices; a top heatsink configured to transfer heat from the NAND devices coupled to the top heatsink; a bottom cover configured to provide protection to components within the PCIe assembly from physical damage; and an input/output bracket (IO bracket) positioned between the top heatsink and the bottom cover, the IO bracket including at least one heat pipe coupled to the controller, the IO bracket configured to transfer heat from the controller.

In example 2, the subject matter of example 1 can optionally include wherein the IO bracket further comprises a faceplate, the at least one heat pipe coupled to and extending horizontally from a surface of the faceplate.

In example 3, the subject matter of any of examples 1-2 can optionally include wherein the IO bracket further comprises a heatsink fin structure, the heatsink fin structure comprising a plurality of fins extending from the surface of the faceplate.

In example 4, the subject matter of any of examples 1-3 can optionally include wherein the IO bracket further comprises a plurality of vents positioned in the faceplate, the plurality of vents configured to allow airflow to flow through the PCIe assembly and out through the vents.

In example 5, the subject matter of any of examples 1-4 can optionally include wherein the plurality of vents are positioned between a plurality of fins that extend horizontally from the surface of the faceplate.

In example 6, the subject matter of any of examples 1-5 can optionally include wherein the at least one heat pipe is connected to the faceplate via one or more connecting members that are coupled along the faceplate.

In example 7, the subject matter of any of examples 1-6 can optionally include wherein the controller is disconnected from the top heatsink.

In example 8, the subject matter of any of examples 1-7 can optionally include wherein the at least one heat pipe comprises two heat pipes; and each of the two heat pipes has a different diameter.

In example 9, the subject matter of any of examples 1-8 can optionally include wherein the at least one heat pipe comprises two heat pipes; and the two heat pipes have a same diameter.

In example 10, the subject matter of any of examples 1-9 can optionally include wherein the controller is coupled to a surface of the at least one heat pipe or a controller plate.

In example 11, the subject matter of any of examples 1-10 can optionally include wherein the PCIe assembly is American Society of Heating, Refrigerating and Air-Conditioning Engineers (ASHRAE) A3 compliant.

Example 12 is an input/output (IO) bracket for use in a solid-state drive (SSD). The IO bracket comprises a faceplate; and at least one heat pipe coupled to the faceplate and extending horizontally from a surface of the faceplate, the at least one heat pipe configured to be coupled to a controller of the SSD and to transfer heat from the controller out of the SSD.

In example 13, the subject matter of example 12 can optionally include a heatsink fin structure, the heatsink fin structure comprising a plurality of fins extending from the surface of the faceplate.

In example 14, the subject matter of any of examples 12-13 can optionally include a plurality of vents positioned in the faceplate, the plurality of vents configured to allow airflow to exit the SSD.

In example 15, the subject matter of any of examples 12-14 can optionally include wherein the plurality of vents are positioned between a plurality of fins that extend from the surface of the faceplate.

In example 16, the subject matter of any of examples 12-15 can optionally include wherein the controller is disconnected from a top heatsink of the SSD, the top heatsink configured to transfer heat from NOT AND (NAND) devices of the SSD.

In example 17, the subject matter of any of examples 12-16 can optionally include wherein the at least one heat pipe comprises two heat pipes; and each of the two heat pipes has a different diameter.

In example 18, the subject matter of any of examples 12-17 can optionally include wherein the at least one heat pipe comprises two heat pipes; and the two heat pipes have a same diameter.

In example 19, the subject matter of any of examples 12-18 can optionally include wherein the controller is coupled to a surface of the at least one heat pipe.

In example 20, the subject matter of any of examples 12-19 can optionally include wherein the at least one heat pipe is connected to the faceplate via one or more connecting members that are coupled along the faceplate The embodiments illustrated herein are believed to be described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present invention. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present invention as represented by the appended claims. The specification and drawings are, accordingly, to be regarded in an illustrative rather than a restrictive sense.

What is claimed is:

1. A peripheral component interconnect express (PCIe) assembly comprising:
   a controller and NOT AND (NAND) devices;
   a top heatsink configured to transfer heat from the NAND devices coupled to the top heatsink;
   a bottom cover configured to provide protection to components within the PCIe assembly from physical damage; and
   an input/output bracket (IO bracket) positioned between the top heatsink and the bottom cover, the IO bracket including at least one heat pipe coupled to the controller, the IO bracket configured to transfer heat from the controller.

2. The PCIe assembly of claim 1, wherein the IO bracket further comprises a faceplate, the at least one heat pipe coupled to and extending horizontally from a surface of the faceplate.

3. The PCIe assembly of claim 2, wherein the IO bracket further comprises a heatsink fin structure, the heatsink fin structure comprising a plurality of fins extending from the surface of the faceplate.

4. The PCIe assembly of claim 2, wherein the IO bracket further comprises a plurality of vents positioned in the faceplate, the plurality of vents configured to allow airflow to flow through the PCIe assembly and out through the vents.

5. The PCIe assembly of claim 4, wherein the plurality of vents are positioned between a plurality of fins that extend from the surface of the faceplate.

6. The PCIe assembly of claim 2, wherein the at least one heat pipe is connected to the faceplate via one or more connecting members that are coupled along the faceplate.

7. The PCIe assembly of claim 1, wherein the controller is disconnected from the top heatsink.

8. The PCIe assembly of claim 1, wherein:
   the at least one heat pipe comprises two heat pipes; and
   each of the two heat pipes has a different diameter.

9. The PCIe assembly of claim 1, wherein:
   the at least one heat pipe comprises two heat pipes; and
   the two heat pipes have a same diameter.

10. The PCIe assembly of claim 1, wherein the controller is coupled to a surface of the at least one heat pipe or a controller plate.

11. The PCIe assembly of claim 1, wherein the PCIe assembly is American Society of Heating, Refrigerating and Air-Conditioning Engineers (ASHRAE) A3 compliant.

12. An input/output (IO) bracket for use in a solid-state drive (SSD), the IO bracket comprising:
   a faceplate; and
   at least one heat pipe coupled to the faceplate and extending horizontally from a surface of the faceplate, the at least one heat pipe configured to be coupled to a controller of the SSD and to transfer heat from the controller out of the SSD.

13. The IO bracket of claim 12, further comprising:
   a heatsink fin structure, the heatsink fin structure comprising a plurality of fins extending from the surface of the faceplate.

14. The IO bracket of claim 12, further comprising:
   a plurality of vents positioned in the faceplate, the plurality of vents configured to allow airflow to exit the SSD.

15. The IO bracket of claim 14, wherein the plurality of vents are positioned between a plurality of fins that extend from the surface of the faceplate.

16. The IO bracket of claim 12, wherein the controller is disconnected from a top heatsink of the SSD, the top heatsink configured to transfer heat from NOT AND (NAND) devices of the SSD.

17. The IO bracket of claim 12, wherein:
   the at least one heat pipe comprises two heat pipes; and
   each of the two heat pipes has a different diameter.

18. The IO bracket of claim 12, wherein:
   the at least one heat pipe comprises two heat pipes; and
   the two heat pipes have a same diameter.

19. The IO bracket of claim 12, wherein the controller is coupled to a surface of the at least one heat pipe or a controller plate.

20. The IO bracket of claim 12, wherein the at least one heat pipe is connected to the faceplate via one or more connecting members that are coupled along the faceplate.

* * * * *